United States Patent
Solberg et al.

[11] Patent Number: 5,944,964
[45] Date of Patent: *Aug. 31, 1999

[54] METHODS AND APPARATUS FOR PREPARING LOW NET STRESS MULTILAYER THIN FILM COATINGS

[75] Inventors: Scott Eugene Solberg; Bradley James Pond, both of Sonoma, Calif.

[73] Assignee: Optical Coating Laboratory, Inc., Santa Rosa, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/800,919

[22] Filed: Feb. 13, 1997

[51] Int. Cl.$^6$ .................................................. C23C 14/34
[52] U.S. Cl. ............................ 204/192.26; 204/192.22; 204/192.23; 204/192.12
[58] Field of Search ................ 204/192.12, 192.15, 204/192.22, 192.23, 192.26, 192.27, 192.28, 192.29, 298.26

[56] References Cited

U.S. PATENT DOCUMENTS

| | | |
|---|---|---|
| 2,858,240 | 10/1958 | Turner et al. |
| 4,851,095 | 7/1989 | Scobey et al. .......................... 204/192 |
| 5,225,057 | 7/1993 | LeFebvre et al. ................. 204/192.13 |
| 5,618,388 | 4/1997 | Seeser et al. ....................... 204/298.26 |

Primary Examiner—Nam Nguyen
Assistant Examiner—Rodney G. McDonald
Attorney, Agent, or Firm—Workman, Nydegger & Seeley

[57] ABSTRACT

It has been discovered that control of the intra-layer stress in layers of high refractive index materials, such as zirconia and titania, permits low net stress multilayer thin film stacks comprising alternating layers of the high refractive index material and silica, a low refractive index material, to be sputter-deposited on glass substrates. In particular, a simple, cost-effective and readily reproducible post-deposition annealing process is used, i.e., an annealing process that can be effected within a broad temperature range and for a brief and substantially open-ended time period, to change the post-deposition microstructure of the high refractive index film layers and create a selected intra-layer tensile stress. The intra-layer tensile stress created during such an annealing process is largely dependent on the post-deposition microstructure of the high refractive index thin film layers. It has been further discovered that the deposition conditions and, in particular, ion bombardment energy, can be controlled to provide a selected and reproducible post-deposition microstructure that is partially amorphous and partially crystalline and which transforms during annealing to a very dense crystalline microstructure. This transformation results in film shrinkage and, because the film is constrained by the glass substrate, the film shrinkage produces a selected amount of tensile stress that compensates for the compressive stress of the silica thin film layers.

20 Claims, 7 Drawing Sheets

METHODS AND APPARATUS FOR PREPARING LOW NET STRESS MULTILAYER THIN FILM COATINGS

BACKGROUND OF THE INVENTION

1. The Field of the Invention

The present invention is directed to methods and apparatus for preparing multilayer thin oxide film coatings that have a low net stress. More specifically, the present invention is directed to methods and apparatus for sputter-depositing multilayer thin oxide film coatings which exhibit excellent optical performance, virtually no moisture adsorption, low optical scatter, and a low net stress.

2. The Relevant Technology

Optical filters have numerous diverse applications related to controlling the reflection, transmission, and absorption of light of varying wavelengths. Many filters comprise very thin layers of materials (usually transparent) deposited serially onto the surface of a dielectric or metallic substrate in order to control the way in which the surface reacts to incident light energy. Based on the principle of destructive and constructive interference of light waves, these thin film optical coatings reflect selected portions of the spectrum while transmitting other portions of the spectrum.

The terms "coatings" and "filters" are used interchangeably herein to refer to any type of optical coating deposited on a substrate. Potential substrates include inorganic and organic glasses and similar crystalline materials and metals. Suitable substrates for a particular application are selected on the basis of optical properties, i.e., internal absorption or transmittance, as well as physical and chemical properties affecting the stability of the substrate during exposure to various conditions related to handling and manufacturing of the filter and to the environment in which the filter substrate will be used.

For most optical applications, the coating materials are inorganic, usually consisting of metals, metal oxides (silicon dioxide, titanium dioxide, zirconium dioxide, etc.) and metal nitrides (silicon nitride, aluminum nitride, boron nitride, etc.). Other coating materials include carbides (silicon carbide, germanium carbide, etc.), fluorides, mixtures of metal oxides, or mixtures of oxides and fluorides. The number of layers in the coating may range from a single thin film layer for very simple antireflection or barrier coatings to multilayer stacks of thin films having more than 50 layers for more complex coatings, such as those which separate infrared from visible light.

Depending on the optical application, the physical thickness of the thin film layers can range in order of magnitude from the angstrom range to the micrometer range. A typical thin film layer physical thickness is on the order of 0.1 $\mu$m (1000 Å or 100 nm) although relatively much thinner and relatively much thicker layers are commonly used for some types of filters. As used in this application, a "thick" multilayer thin film stack refers to stacks having a physical thickness greater than about 2 $\mu$m (2000 nm). In addition to physical thickness, thin film layers may also be usefully described in terms of optical thickness and, particularly, in terms of the quarter wave optical thickness. Thus, it is necessary to specify the type of thickness being described when referring to optical thin films.

As with substrate materials, the coating materials and the physical and optical thicknesses are selected to attain the desired optical properties although the chemical and physical properties of the thin film stacks are a major consideration as well. Composition- and microstructure-dependent properties such as mechanical stress, moisture content, crystallization and surface morphology of the thin films affect the reliability and performance of the optical device. For example, excessive mechanical stress in an optical coating can result in cracking or delamination of the coating or warping or breakage of the substrate. Moisture content affects the optical performance, e.g., refractive index, as well as the environmental stability of an optical coating. Crystallization can cause stress-induced cracking and rough morphology resulting in optical scattering and loss of mechanical integrity of the coating. Surface morphology also has effects on optical scatter and physical properties of the film.

These properties are affected by factors such as the deposition technique, deposition conditions, deposition rate, material purity and composition, and post-deposition processing such as annealing. Due to the complex interrelatedness of the optical and mechanical properties, both desirable and undesirable effects may occur in response to a particular factor. For example, higher temperatures and lower pressures during coating deposition will typically generate a higher packing density and smaller porosity than low temperature or high pressure conditions. The higher density provides fewer paths for moisture penetration and smaller surface area for water adsorption and, thus, increased moisture stability. High temperatures, however, may not be compatible with some substrate materials, e.g., many plastics, while lower reactive gas pressures do not produce the stoichiometric compositions having the desired optical properties such as low absorbance. Another example is post-deposition annealing which may be used to reduce adsorbed water and increase film density. Annealing, however, may also cause degradation of optical performance due to partial crystallization of amorphous materials, inter-diffusion between the layers, structure-related alteration of index of refraction or increase in optical scatter, or thermal stress-induced mechanical failure.

Multilayer thin film stacks comprise at least two different coating materials. For many applications, it is useful to alternate high index (of refraction) materials with low refractive index materials. Silicon dioxide (silica), $SiO_2$, is a commonly used low refractive index material and is the lowest refractive index material typically deposited with sputter deposition techniques. Thus, multilayer film stacks comprising alternating thin film layers of silica and a high refractive index material are useful for many optical applications.

Evaporation and sputtering are two very useful thin film physical vapor deposition techniques for depositing multilayer thin film stacks. Evaporated thin film layers are typically more porous than sputtered thin film layers. Ion bombardment during deposition with either of these techniques has been shown to advantageously increase the density of the deposited thin films. Silica coatings have an intrinsic compressive stress and the use of silica as the low refractive index material may result in very compressively stressed stacks subject to warping or cracking. Multiple thin layers of silica in a multilayer thin film stack contribute a significant compressive stress, particularly for thick multilayer thin film stacks, i.e., stacks having a physical thickness greater than about 2 $\mu$m. The more dense the silica layers, the greater the intra-layer compressive stress. Thus, sputtered silica films, and particularly ion-assisted sputtered silica films, tend to be very highly compressively stressed.

One approach to obtaining a low net stress thin film stack having silica as the low refractive index material is to balance the compressive stress with an identical coating deposited on the opposite surface of the substrate. This approach, however, is not very economical since it requires duplication of a multilayer thin film stack when the desired optical performance can be achieved with a single multilayer thin film stack.

Another approach to obtaining a low net stress thin film stack having silica as the low refractive index material is to balance the compressive stress with a high refractive index material that can provide a compensating, i.e., tensile stress. One source of tensile stress in thin film layers is volume shrinkage that occurs during a post-deposition annealing process. Such shrinkage may be due to crystallization phase changes and/or removal of adsorbed water. Although the crystallization which occurs during annealing results in shrinkage and an increase in tensile stress, the crystallization also may result in increased optical scatter. To minimize this optical scatter, a carefully controlled partial annealing process can be used to transform the microstructure of the thin film layers to an intermediate state between essentially amorphous and significantly crystalline. Because the partial annealing process must be carefully controlled to limit the extent of crystallization, the amount of tensile stress created is also limited. For that reason, the amount of compressive stress that can be balanced is also limited. Because dense films have more compressive stress than porous films, the compressive stress of the silica may also be balanced by depositing porous high refractive index thin film layers. These optical coatings have reduced moisture stability however, because of the porous thin film layers.

Even though silica has an intrinsic compressive stress, it is possible for a multilayer thin film stack comprising silica alternating with layers of high refractive index material to have an overall net tensile stress due to excessive tensile stress developing within the high refractive index material during the post-deposition annealing process. An excessive tensile stress may also be created in a coating deposited at high temperatures on a low thermal expansion substrate such as fused silica. In addition, depending on the porosity of the thin film layers, the annealing process will remove adsorbed water resulting in shrinkage and an increase in tensile stress in both the silica and the titania or zirconia layers. Thus, even annealing at temperatures below which significant crystallization within the high index material layers occurs, an overall net tensile stress may be created which results in cracking of the film stack or warping and optical distortion in the filter.

One approach to reducing the tensile stress within the high refractive index material utilizes co-deposition of another material, such as silica, to produce composite layers. The composite layers have been shown to have less tensile stress than the pure material layers but the composite layers also have altered optical properties, e.g., decreased index of refraction and increased absorption, which affect the optical performance of the multilayer thin film stack. See, e.g., Russak, M. A., Jahnes, C. V., "Reactive magnetron sputtered zirconium oxide and zirconium silicon oxide thin films," J. Vac. Sci. Technol. A 7 (3), May/Jun 1989; 1248–1253; Pond, B. J., DeBar, J. I., Carniglia, C. K., Raj, T., "Stress reduction in ion beam sputtered mixed oxide films," Applied Optics, Vol. 28 (14), 1989; 2800–2804; Sankur, H., Gunning, W., "Sorbed water and intrinsic stress in composite $TiO_2$-$SiO_2$ films," J.Appl. Phys. 66 (2), 1989; 807–812.

In view of the above, it will be appreciated that low stress multilayer coatings comprising alternating layers of high refractive index material such as titania or zirconia with the low refractive index material, silica, can be obtained by several known methods. An effective although uneconomical method involves balancing the stress in one coating with an identical coating on the opposite side of the substrate. Another method involves carefully controlling a partial annealing process of evaporated porous thin film layers. Problems with this approach include the difficulty of precisely controlling the annealing process and the moisture instability of the porous layers. Co-deposition of a second material with the high refractive index material has been shown to reduce the intra-layer tensile stress of the high refractive index material, however, at the cost of some reduction in optical performance. Currently, no practical method of co-depositing another material with silica has been found to significantly reduce the compressive stress without adversely affecting optical or environmental durability of the coating.

It will be appreciated that it would be an advance in the art to provide methods and apparatus for preparing multilayer thin oxide film coatings comprising alternating layers of a high refractive index material and silica that have a low net stress and also demonstrate excellent optical performance, virtually no moisture adsorption, and low optical scatter. It would be a further advancement to provide such methods and apparatus which are cost-effective, simple and reliable and which utilize conventional optical coating deposition techniques and equipment.

SUMMARY AND OBJECTS OF THE INVENTION

It is an object of the present invention to provide methods and apparatus for preparing multilayer thin oxide film coatings that have a low net stress. In particular, it is an object of the present invention to provide optical devices comprising alternating layers of a high refractive index material and silica which have a net stress that is significantly lower than currently available optical devices comprising alternating layers of a high refractive index material and silica.

It is another object of the present invention to provide methods and apparatus for preparing low net stress environmentally stable multilayer thin oxide film coatings which demonstrate excellent optical performance, virtually no moisture adsorption, and low optical scatter.

It is a further object of the present invention to provide methods and apparatus for preparing low net stress optical coatings which are cost-effective, simple and reliable.

Yet another object of the present invention is to provide methods and apparatus for preparing low net stress optical coatings which utilize conventional optical coating deposition equipment and techniques. In particular, it is an object of the present invention to prepare low net stress optical devices utilizing a magnetron sputter deposition process and machine.

These and other objects and features of the present invention will become more fully apparent from the following description and appended claims, or may be learned by the practice of the invention as set forth hereinafter.

In accord with the present invention, it has been discovered that the microstructure of thin layers of high refractive index material can be controlled during a sputter deposition process such that a selected intra-layer tensile stress develops during a post-deposition annealing process. Control of the intra-layer stress in layers of high refractive index materials, such as zirconia and titania, permits multilayer thin film stacks comprising alternating layers of the high refractive index material and silica, a low refractive index material having intrinsic compressive stress, to be sputter-deposited onto glass substrates and subsequently annealed to thereby prepare low net stress optical coatings. In addition to demonstrating low net stress, and unlike low net stress sputtered optical coatings comprising silica known in the art, the low net stress optical coatings are dense and, therefore, moisture stable. The low net stress optical coatings also preferably exhibit low optical scatter.

In particular, it is a feature of the present invention to control the microstructure of the post-deposition layers of high refractive index material to thereby achieve a desired tensile stress during a post-deposition annealing process. It has been discovered that the deposition conditions and, in particular, the ion bombardment energy, can be controlled to provide a selected and reproducible post-deposition microstructure partially amorphous and partially crystalline. It has been further discovered that, when the selected post-deposition microstructure is annealed in accord with the present invention, the microstructure transforms to a very dense crystalline microstructure having a selected amount of tensile stress that compensates for the compressive stress of the silica thin film layers. Unlike some prior art optical coatings comprising alternating layers of silica and a high refractive index material, both the post-deposition and post-annealing microstructures are dense and moisture stable. The annealing process is simple, cost-effective and readily reproducible because it can be effected within a broad but moderate temperature range and for a relatively brief and substantially open-ended time period.

The crystallization that occurs during annealing, however, may contribute to increased optical scatter. Thus, it is another feature of the present invention to control the post-deposition microstructure of the high refractive index layers such that the post-anneal microstructure has an average intra-layer grain size that results in minimal optical scatter within the wavelength range of interest.

BRIEF DESCRIPTION OF THE DRAWINGS

In order that the manner in which the above-recited and other advantages and objects of the invention are obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Figure 1:
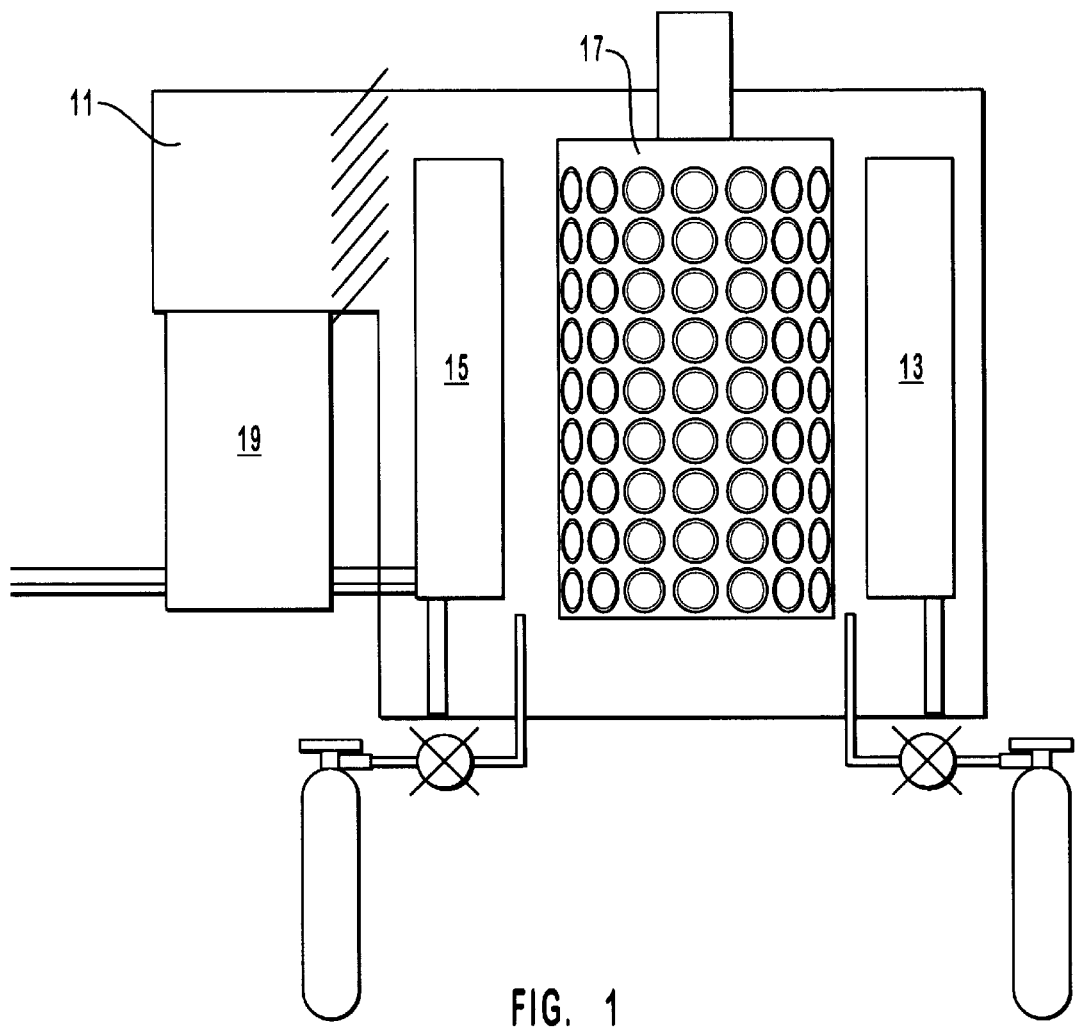
FIG. 1 is a schematic representation of the MetaMode® magnetron sputtering chamber.

Stresses in a thin film can have several components. Intrinsic stresses develop as the film is being formed and achieves a specific microstructure having specific grain characteristics and intergrain forces. A second major source of stress is due to the differences in the coefficient of thermal expansion of the film and that of the substrate or adjacent film layers causing the different materials to experience different degrees of expansion and shrinkage upon, respectively, heating and cooling. Because typical deposition temperatures are higher than ambient temperatures, stress develops when the temperature changes from the deposition temperature. Even when films are deposited nominally at room temperature, some heating of the substrate can occur during the deposition and condensation process. Finally, temperature variations during use may lead to changes in the stress level. The sign of the thermally induced stress can change from tensile to compressive, or vice versa, as it is a function of the differences in the thermal expansion coefficients of the film and substrate materials. Thus, many factors affect the overall net stress of an optical coating.

Multilayer thin film stacks comprising alternating layers of high refractive index oxide material and low refractive index oxide material are used for many types of optical coatings or filters. Silica (silicon dioxide) is a very useful low refractive index material. Thin film layers of silica, however, have intrinsic compressive stress. Excessive stress in an optical coating can result in cracking or delamination of the coating or optical distortions due to bending or warping of the substrate. Thus, particularly for thick optical coatings, i.e., coatings greater than about 2 $\mu$m (2000 nm), the compressive stress of the silica layers can be excessive.

Silica-based glasses are preferred substrates for many optical coatings because of their low cost, broad range of available sizes and shapes, and excellent optical properties. Two high refractive index oxide materials compatible with glass substrates are titania (titanium oxide) and zirconia (zirconium oxide). A common technique to densify and stabilize titania and zirconia thin film layers involves a post-deposition annealing process. Annealing results in volume shrinkage of the thin film layers due to removal of adsorbed water, if present, and to crystallization phase changes. Because the thin film layers are constrained by the substrate, which does not shrink, this volume shrinkage results in the development of tensile stress within the film layers. Indeed, the integrated tensile stress may exceed the integrated compressive stress of silica resulting in multilayer thin film stacks having an excessive net tensile stress also resulting in loss of mechanical integrity or poor optical performance. In addition, the crystallization that occurs during annealing may contribute to increased optical scatter which also degrades optical performance.

Optical coatings having net tensile stress produce concave net curvature of the substrate whereas compressively stressed coatings result in a convexly curved substrate. For this reason, net film stress may be approximated from measurements of the net curvature of the coated substrate, i.e., the curvature change from the original substrate curvature. For example, one method for evaluating net curvature is to measure the number of fringes at a selected wavelength with an interferometer and converting the information into a stress value. Conventional knowledge maintains that optical coatings comprising a substrate having multilayer optical coatings comprising alternating layers of silica and high refractive index metal oxide material deposited thereon will generally have some net stress, either compressive or tensile depending on preparation technique and the specific alternating materials. Prior to the present invention, dense sputtered or ion assisted evaporated coatings having alternating layers of silica and a high refractive index metal oxide have typically had stresses of $100 \times 10^6$ Pa (kg/(m-s$^2$)) or more.

Optical coatings prepared in accord with the present invention, however, have significantly lower net stresses typically less than $30 \times 10^6$ Pa. Thus, as used herein, the phrase "low net stress optical device" refers to an optical device comprising a substrate having multilayer optical coatings comprising alternating layers of silica and high refractive index metal oxide material deposited thereon wherein the net curvature of the coated substrate, measured with an interferometer at a selected wavelength of interest, is on the order of one-half to one-fifth, or less, of a typical net curvature in a currently available optical device comprising a similar substrate having optically similar multilayer coatings comprising alternating layers of silica and high refractive index metal oxide material deposited thereon.

In accord with the present invention, it has been surprisingly discovered that multilayer thin film stacks comprising alternating dense layers of high refractive index zirconia or titania and silica, a low refractive index material having compressive stress, can be sputter-deposited with ion bombardment onto glass substrates and subsequently annealed to thereby prepare low net stress optical coatings. In a preferred embodiment of the present invention, optical coatings comprising multilayer thin film stacks are prepared using a magnetron sputtering system and process which are described in detail in commonly assigned U.S. Pat. Nos. 4,851,095, issued to Scobey et al., and 5,225,057, issued to LeFebvre et al., the entire disclosures of which are herein incorporated by reference. The assignee of these two patents, Optical Coating Laboratories, Inc. ("OCLI") manufacturers equipment which embodies the technology of these patents. OCLI uses its trademark "MetaMode®" in connection with such equipment.

MetaMode® is a modified sputtering process that uses magnetron sputter sources to deposit metal onto the substrates mounted on a rotation drum. A schematic representation of a MetaMode® chamber is shown in FIG. 1. A high sputtering rate is obtained by keeping the operation of the sputtering target in metal mode and performing the oxidizing or nitriding of the growing film at a location remote from the target. To facilitate this deposition process, the coating chamber 11 is configured with long vertically oriented sputter sources 13 that permit the film to be grown incrementally, i.e., depositing a few monolayers of metal, oxidizing, depositing a few more monolayers, oxidizing, etc. until a full thickness layer is obtained. The oxidization is accomplished using an ion gun 15, also long and vertically oriented, to bombard the surface of the rotatable drum 17 with activated or ionized oxygen. The ion gun is a gridless, reverse magnetron type. Switching from one target (sputter source) to another within the chamber permits efficient deposition of multilayer optical coating designs. A pump 19 is used to control the pressure within the coating chamber.

The MetaMode® process is particularly suitable for application of this invention since it permits precise manipulation of the deposition conditions, and particularly the ion gun energy, such that the intra-layer stress in layers of high refractive index material can be controlled to create a selected tensile stress that compensates for the compressive stress of the alternating silica layers. In addition, in accord with a preferred embodiment of the present invention, the MetaMode® process permits deposition of extremely thin layers of an isolator material to be deposited between sub-layers of the high refractive index material. The extremely thin layers provide physical separation of the sub-layers but are substantially optically and physically inert.

In particular, it has been discovered that control of the microstructure during sputter deposition of dense layers of high refractive index zirconia or titania results in the development of a selected intra-layer tensile stress during a post-deposition annealing process. Thus, the intra-layer stresses of the high refractive index layers are controlled to create a selected tensile stress that compensates for the compressive stress of the alternating silica layers.

Unlike some prior art optical coatings comprising alternating layers of silica and a high refractive index material, both the post-deposition and post-annealing microstructures are dense and moisture stable. Film density is inferred from the extent of moisture penetration or can be estimated from direct measurements obtained using the Rutherford Backscattering technique. For simplicity, film densities have been assessed indirectly herein. The optical properties of coatings prepared in accord with the present invention were spectrophotometrically determined both in "dry" conditions, created within a chamber purged with a dry gas, and in ambient humidity conditions. A change in the index of refraction of the coating when measured under the dry and the ambient conditions indicates moisture penetration. Essentially no shifts in the index of refraction were seen in either the post-deposition and or the post-annealing optical coating samples.

It is a feature of the present invention to control the microstructure of the post-deposition layers of high refractive index material to thereby achieve a desired tensile stress during a post-deposition annealing process. It has been discovered that the deposition conditions and, in particular, the ion energy, can be controlled to provide a selected and reproducible post-deposition microstructure that is partially amorphous and partially crystalline. Control of the ion energy has been surprisingly discovered to permit control of the post-deposition microstructure and, in turn, control of the post-annealing microstructure such that a selected tensile stress is created in the layers of high refractive index material that substantially compensates for the inherent compressive stress of the silica layers. The most important aspect of controlling the ion energy appears to be related to achieving a sufficient ion impingement ratio, i.e., ratio of impinging ions to the quantity of material deposited, such that the desired dense, partially amorphous, and partially crystalline microstructure is achieved. It is known that the effects of selecting various deposition conditions, e.g., the deposition rate, gas pressures, ion gun energy, and geometries of the system, are interrelated. Although the exemplary embodiments were prepared at the specific deposition conditions described below, it will be appreciated that other combinations of deposition conditions, e.g., deposition rates, gas pressures, ion gun energies, and system geometries, will also produce sufficient ion impingement ratios to prepare the optical devices taught herein. For example, because the ion impingement ratio is important, lower anode currents could be used if the deposition rates were also lower.

It has been further discovered that, when the selected post-deposition microstructure is annealed with a simple, cost-effective and readily reproducible annealing process, i.e., an annealing process that can be effected within a broad but moderate temperature range and for a relatively brief and substantially open-ended time period, the microstructure transforms to a very dense crystalline microstructure. This transformation results in film shrinkage and, because the film is constrained by the glass substrate, the film shrinkage produces a selected amount of tensile stress that compensates for the compressive stress of the silica thin film layers.

For example, zirconia deposited with the MetaMode® process will undergo a specific microstructure transformation resulting in volume shrinkage and a corresponding stress transformation when subjected to a post-deposition annealing process that can be effected within a broad but moderate temperature range and for a relatively brief and substantially open-ended time period. In particular, baking the coating at temperatures of about 290° C. for about 1 hour effects the transformation. Once the transformation from amorphous to crystalline phases is complete, the stress remains essentially stable even at temperatures up to about 500° C. and when the baking period is significantly extended. Thus, the post-deposition annealing process is readily repeatable, simple and cost-effective.

It has been further discovered that the ion bombardment energy and the deposition pressure for zirconia affected the post-annealing stress. This is due to more dense crystalline microstructure forming with increasing ion bombardment and decreasing sputtering pressure. Since the stress change following annealing is due to volume shrinkage when the film crystallizes and densifies, the more dense, crystalline microstructure present during deposition, the less stress change will occur during annealing. This relationship allows for adjustment of the final film stress, for example, to adjust for different layer thicknesses used in different optical coating designs.

It is another feature of the present invention to control the post-deposition microstructure of the high refractive index layers such that the post-anneal microstructure has an average intra-layer grain size that results in minimal optical scatter within the wavelength range of interest. Generally, if the grain sizes grow to at least one Quarter Wave Optical Thickness (QWOT) at the wavelength range of interest, optical scattering will increase. It has been discovered that this scattering can be substantially reduced by splitting the high refractive index material, e.g., zirconia or titania, into sub-layers separated by very, very thin layers, i.e., 1–2 nm, of an isolator material. The isolator material should be physically inert with respect to the high refractive index material so as not to affect the physical properties. Because of the extreme thinness of the isolator material layer, substantially no optical effect is observed even with a low index material such as silica. It will be appreciated that it is most convenient to use silica as the isolator material since the MetaMode® chamber is already set up to deposit silica layers alternating with the high refractive index material.

The optical coating design will determine the wavelength range of interest and this, in turn, determines the composition-dependent QWOT. Depending on the optical coating design, a critical thickness can be determined, the critical thickness being that physical thickness for the high refractive index material that is the thickness above which crystal grains may grow to sizes of at least one QWOT and thereby increase optical scatter. For examples, for optical filters designed for use in the visible spectrum, the critical thickness for zirconia layers is about 40 nm and for titania layers about 30 nm. By splitting layers of high refractive index material which have physical thicknesses greater than the critical thickness into thinner sub-layers, the growth of crystal grains of at least one QWOT can be minimized. Thus, the high refractive index material is deposited, not as a thick monolithic layer, but, as a plurality of sub-layers separated from each other by a very thin and, therefore, substantially optically and physically inert, layer of an isolator material. In this manner, optical performance is maintained and optical scatter is minimized.

Figure 2:
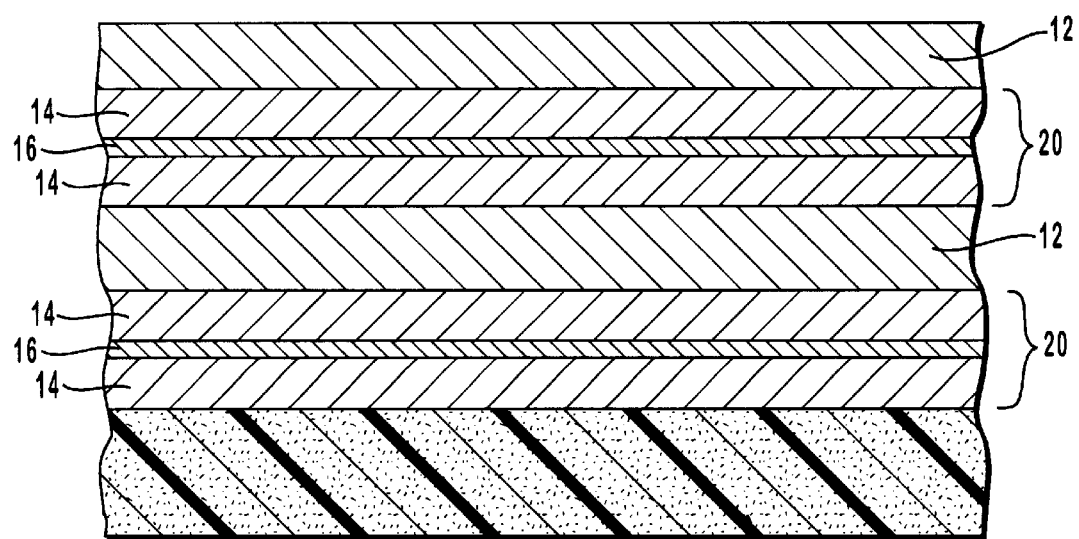
FIG. 2 illustrates schematically a preferred embodiment of a low stress optical coating comprising split zirconia layers in accord with the present invention.

FIG. 2 illustrates schematically a preferred embodiment of a low stress optical coating in accord with the present invention. A glass substrate 10 is coated with alternating multiple layers of zirconia 20 and silica 12. It will be appreciated that the substrate and coating material are not drawn to scale. The physical thickness of each coating material is determined by the design of the optical coating. In accord with the present invention, the zirconia layers 20 are split into zirconia sub-layers 14 separated by a very thin layer 16 of an isolator material such as silica.

EXAMPLE 1

The effect of ion bombardment on the microstructure of thin film zirconia layers was investigated using an OCLI MetaMode® machine having a drum circumference of 355 cm, sputter cathodes 132 cm long and 12.7 cm wide, and dual, 122 cm long, ion gun anodes. The sufficient ratio of ion bombardment to deposited material at the high deposition rates of 3 Å/s for zirconia were obtained with average ion gun anode currents of up to 0.92 milliamps (mA) per $cm^2$ of drum surface, with anode voltages of about 140 Volts.

Figure 3:
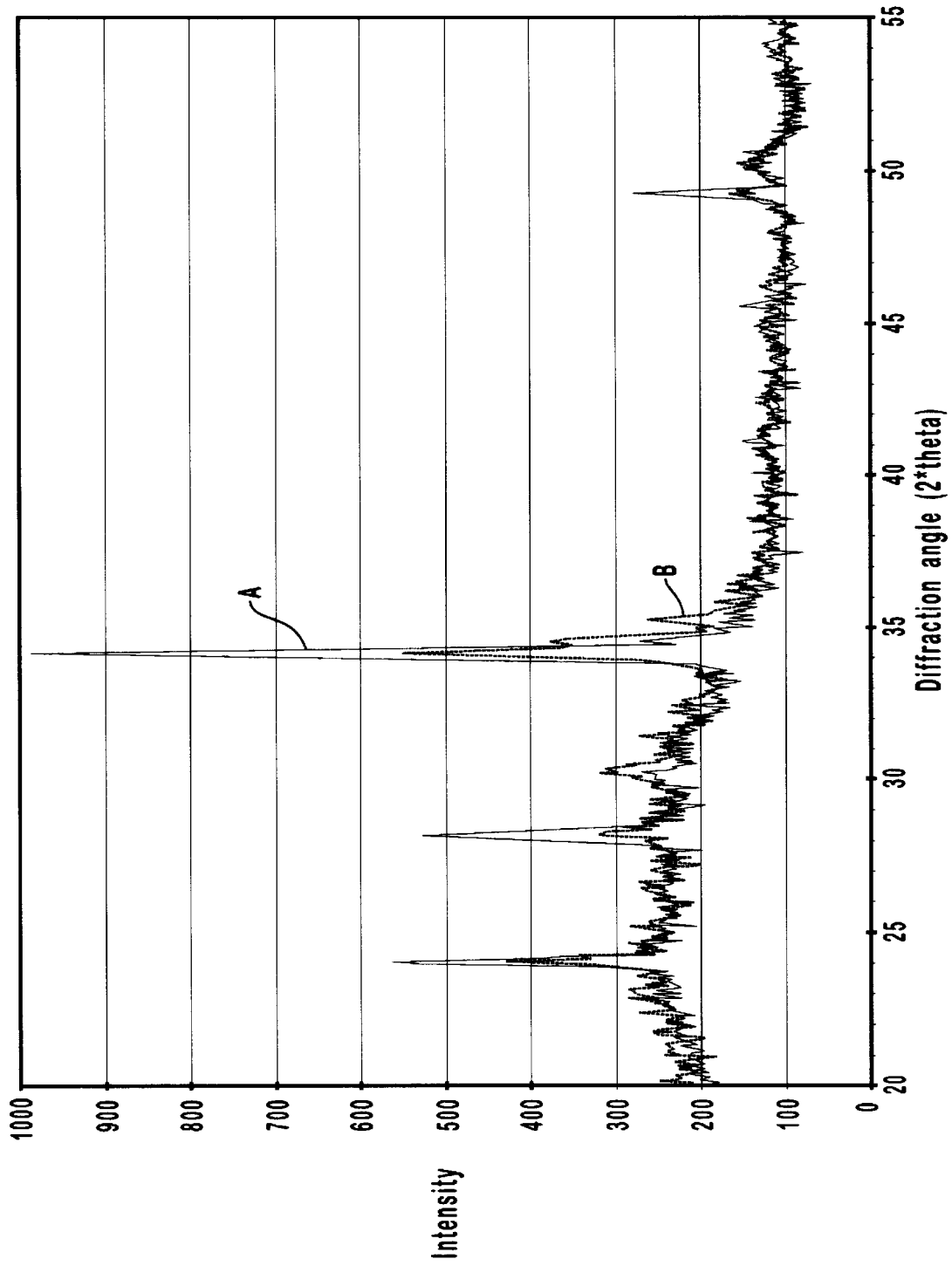
FIG. 3 depicts the x-ray diffraction patterns for a monolithic zirconia layer sputter deposited using an ion gun powered at 20 amps and a monolithic zirconia layer sputter deposited using an ion gun powered at 40 amps.

FIG. 3 is an x-ray diffraction pattern illustrating the microstructure effects of ion bombardment in two monolithic zirconia layers deposited on (soda lime) glass substrates. The microstructural analysis of the films in these examples was carried out using a x-ray diffractometer employing Cu-$\kappa_\alpha$ radiation.

Each substrate was coated with a monolithic zirconia layer having a physical thickness of 500 nm at a coating rate of 3 angstroms/second. For Sample A, the chamber pressure was 0.6 Pa, the sputter cathode was supplied with argon at a flow rate of 400 SCCM, the ion gun was supplied with oxygen at a flow rate of 320 SCCM, another region of the chamber was supplied with Argon at a flow rate of 100 SCCM, and the ion gun anode current averaged 20 amps, i.e., averaging 0.46 mA per $cm^2$ of drum surface. Sample B was prepared at a chamber pressure of 0.54 Pa, the sputter cathode was supplied with argon at a flow rate of 300 SCCM, the ion gun was supplied with oxygen at a flow rate of 300 SCCM, another region of the chamber was supplied with 140 SCCM of argon, and the ion gun anode current was increased to 40 amps, i.e., averaging 0.92 mA per $cm^2$ of drum surface. Note that ion beam current measurements were not taken, thus, anode currents are provided instead.

As seen in FIG. 3, the x-ray diffraction spectra demonstrate several sharp peaks indicating the presence of various crystalline phases of zirconia in both Samples A (solid line) and B (dotted line). The increased ion bombardment during the preparation, i.e., 40 amps vs. 20 amps of ion gun current, during deposition of Sample B resulted in a significant increase in crystallization manifested by the increased intensity of the various peaks and particularly the monoclinic zirconia peaks at 28.3 and 34.3.

Interestingly, evaporated films having more monoclinic microstructure have been shown to have lower refractive indices. The refractive index (at 550 nm) of Sample A was determined to be 2.115 and the refractive index of Sample B was determined to be 2.177. Thus, unlike evaporated films, Sample B had more monoclinic microstructure and, yet, a slightly higher index of refraction than Sample A.

EXAMPLE 2

Figure 4:
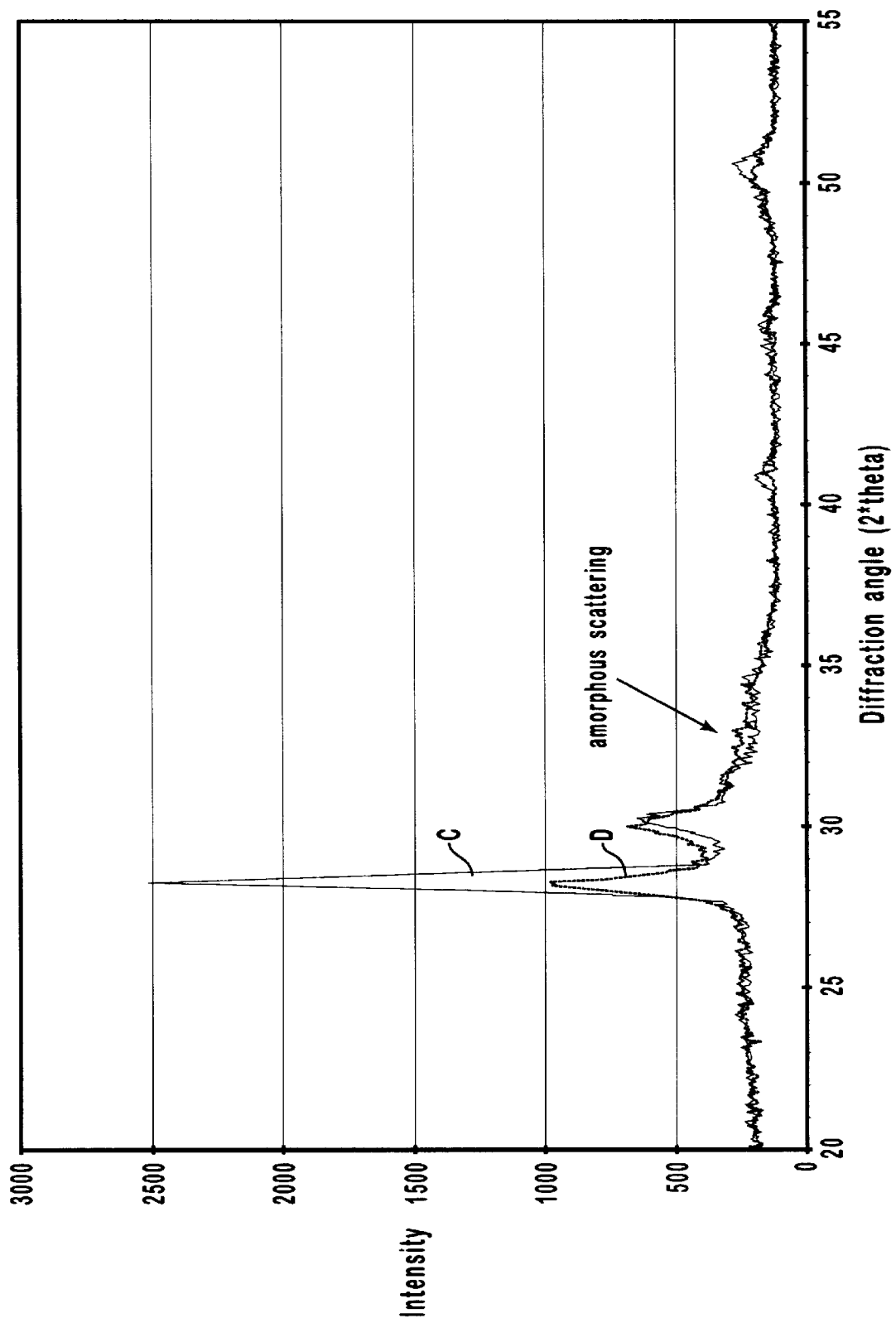
FIG. 4 depicts the post-deposition x-ray diffraction patterns for an optical coating comprising monolithic zirconia layers and for an optical coating comprising split layers of zirconia prepared in accord with the present invention.

The effect of splitting zirconia layers was investigated. FIG. 4 is an x-ray diffraction pattern illustrating the microstructure of Samples C and D. Samples C and D were each 42 layer, 3700 nm physical thickness, broadband reflecting Short Wavepass Filters comprising alternating layers of zirconia and silica on (soda lime) glass substrates. Both samples C and D contained monolithic silica layers. Sample C contained monolithic zirconia layers of about 65–82$\mu$m physical thickness. The zirconia layers in Sample D were not monolithic but were split into two sub-layers of equal thickness separated by a silica layer having a very thin physical thickness of 2 nm. The very thin silica layer serves as an isolator material that is optically and physically inert.

Samples C and D were prepared in the OCLI MetaMode® machine described above under identical process conditions as follows: coating rate 3 angstroms/second; chamber pressure for zirconia layers was 0.6 Pa and for silica layers was 0.4 Pa; for zirconia layers, the sputter cathode was supplied with argon at a flow rate of 350 SCCM, the ion gun was supplied with oxygen at a flow rate of 320 SCCM, and another region of the chamber was supplied with argon at a flow rate of 140 SCCM; for silica layers, the sputter cathode was supplied with neon at a flow rate of 300 SCCM, the ion gun was supplied with oxygen at a flow rate of 140 SCCM, and another region of the chamber was supplied with argon at a flow rate of 140 SCCM. (The use of neon gas to sputter silica has been found to reduce optical scatter as disclosed in co-pending application Ser. No. 08/617,678, filed Mar. 19, 1996, and owned by the assignee of the present application, the entire disclosure of which is herein incorporated by reference.) For the zirconia layers, the ion gun anode current was 30 amps, i.e., averaging 0.7 mA per $cm^2$ of drum surface and, for the silica layers, the ion gun anode current was 20 amps, i.e., averaging 0.46 mA per $cm^2$ of drum surface.

As seen in FIG. 4, the x-ray diffraction spectra demonstrate substantial amorphous scattering with two predominant sharp peaks indicating the presence of various crystalline phase zirconia in both Samples C (solid line) and D (dotted line), particularly a monoclinic zirconia peak at 28.3 and a cubic zirconia peak at 30.5. Sample C, containing monolithic zirconia layers, displays significantly greater peaks than Sample D, containing split zirconia layers.

EXAMPLE 3

Figure 5:
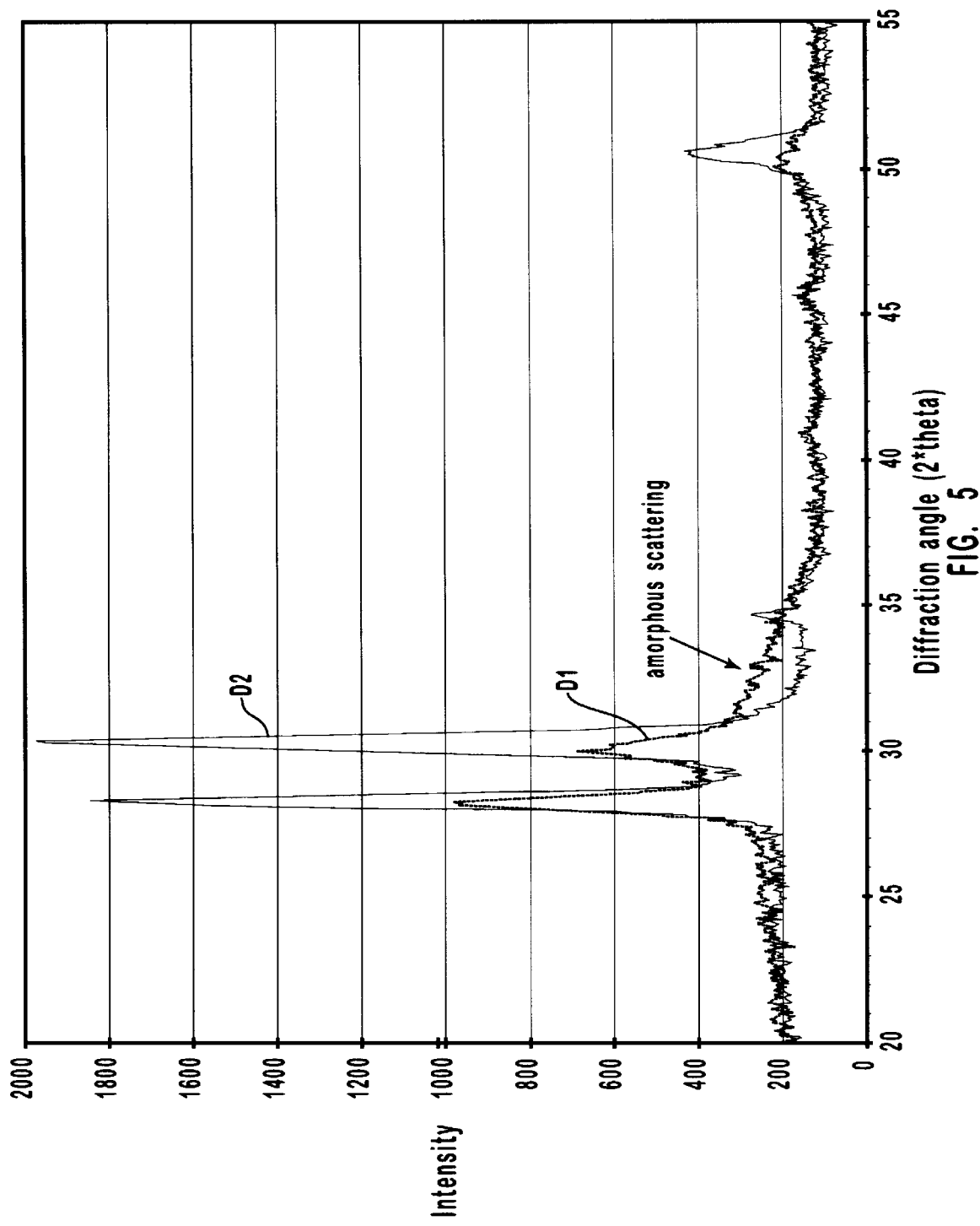
FIG. 5 depicts the post-deposition and the post-annealing x-ray diffraction patterns for the optical coating shown in FIG. 4 comprising split layers of zirconia prepared in accord with the present invention.

The effect of annealing on the microstructure of Sample D, described above in Example 2, was investigated. FIG. 5 is an x-ray diffraction pattern illustrating the microstructure of Sample D following coating deposition, referenced as D1 (dotted line), and following a post-deposition annealing process, referenced as D2 (solid line). The postdeposition annealing process involved baking Sample D in a convection oven at a temperature of 400° C. for a period of about one hour.

As seen in FIG. 5, the x-ray diffraction spectra for Sample D, a 42 layer Short Wavepass Filter comprising alternating layers of optical thicknesses of zirconia and silica on a glass substrate wherein each zirconia layer was split into two sub-layers of equal thickness separated by a 2 nm layer of silica, demonstrate a significant increase in the predominant crystalline peaks following the post-deposition annealing process.

EXAMPLE 4

Figure 6:
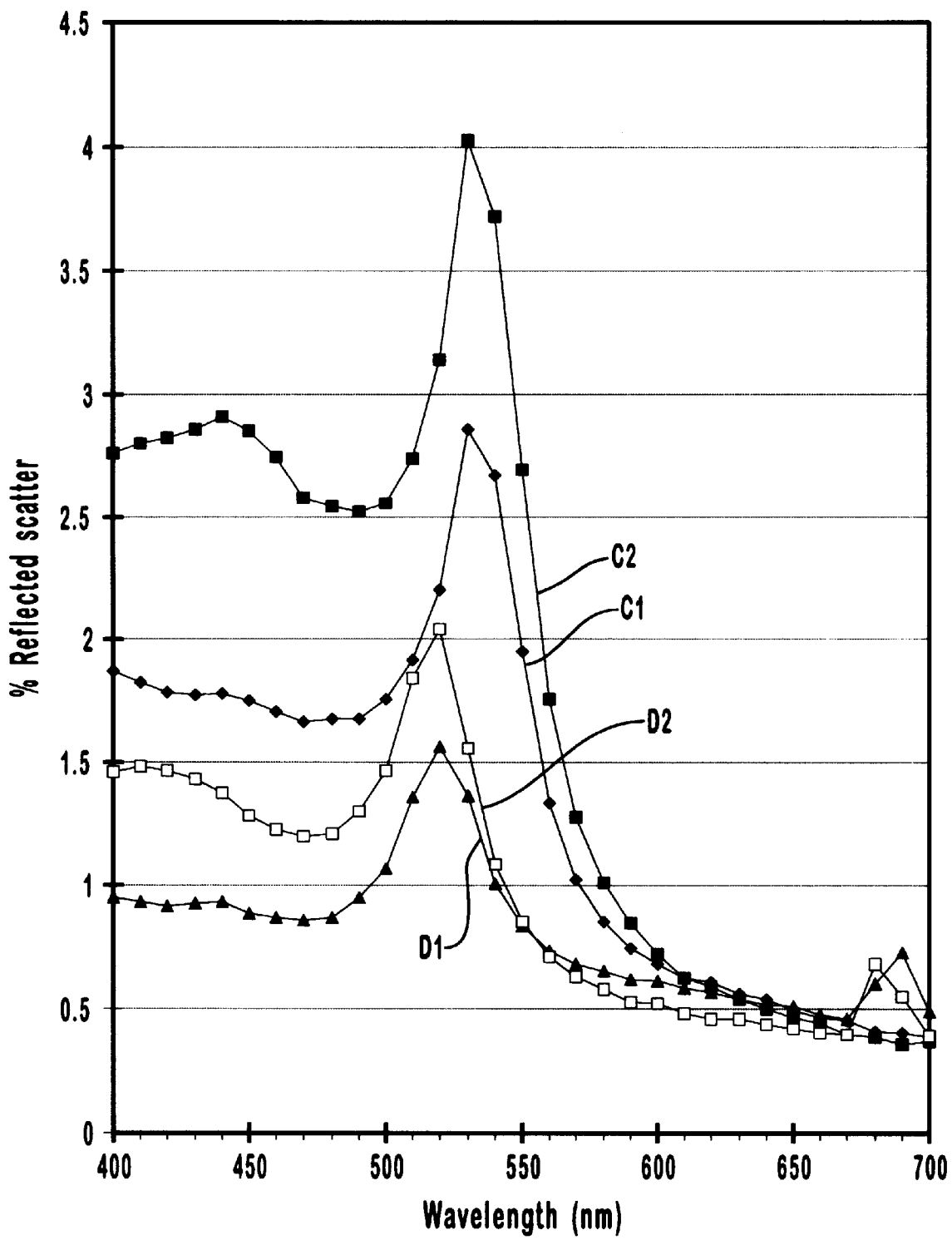
FIG. 6 is a graph illustrating optical scatter for the post-deposition and post-annealing optical coatings shown in FIG. 4.

The effect of annealing on optical scatter was investigated with respect to both Samples C and D, described in Example 2, above. FIG. 6 is a graph comparing the reflected scatter from Samples C and D, following coating deposition, referenced as C1 and D1, respectively, and following a post-deposition annealing process, referenced as C2 and D2, respectively. Sample C was a 42 layer Short Wavepass Filter comprising alternating layers of monolithic optical thicknesses of zirconia and silica on a (soda lime) glass substrate and Sample D was a 42 layer Short Wavepass Filter comprising alternating layers of optical thicknesses of zirconia and silica on a (soda lime) glass substrate wherein each zirconia layer was split into two sub-layers of equal thickness separated by a 2 nm layer of silica. The post-deposition annealing process involved baking both Samples in a convection oven at a temperature of 400° C. for a period of about one hour.

As seen in FIG. 6, Sample C, both following deposition, C1, and following annealing, C2, exhibited higher optical scatter than Sample D, either following deposition, D1, or following annealing, D2. The lowest optical scatter was observed in Sample D following deposition, D1. Optical scatter increased slightly following annealing, D2.

EXAMPLE 5

The effect of annealing temperature on stress in optical coatings comprising multilayer thin film stacks was investigated using an OCLI MetaMode® machine having a drum circumference of 244 cm, sputter cathodes 76 cm long and 9 cm wide, and dual, 66 cm long, ion gun anodes. Multiple layer Short Wavepass Filters comprising alternating layers of zirconia and silica, tantalum oxide and silica, and niobium oxide and silica were prepared on both 25 mm diameter ×0.5 mm thick fused silica substrates and on 25 mm diameter mm thick soda lime glass substrates (for niobium oxide-containing filters) and on 25 mm square ×1 mm thick soda lime glass substrates (for tantalum oxide- and zirconium oxide-containing filters).

The niobium oxide-containing filters comprised 34 layers and had a physical thickness of about 2900 nm. The tantalum oxide- and zirconium oxide-containing filters comprised 42 layers and had physical thicknesses of about 3700 nm. For the niobium oxide-containing filters: the niobium oxide layers were deposited at a rate of 2.3 angstroms/second, the sputter gas was argon supplied at a flow rate of 500 SCCM, the ion gun was supplied with oxygen at a flow rate of 240 SCCM, and the chamber pressure was 0.5 Pa. For the tantalum oxide-containing filters: the tantalum oxide layers were deposited at a rate of 3 angstroms/second, the sputter gas was argon supplied at a flow rate of 500 SCCM, the ion gun was supplied with oxygen at a flow rate of 280 SCCM, and the chamber pressure was 0.53 Pa. For the zirconium oxide-containing filters: the zirconium oxide layers were deposited at a rate of 3 angstroms/second, the sputter gas was argon supplied at a flow rate of 350 SCCM, the ion gun was supplied with oxygen at a flow rate of 150 SCCM, and the chamber pressure was 0.33 Pa. The ion gun anode current was 7 amps, i.e., averaging 0.43 mA per $cm^2$ of drum surface, in all cases.

For all filters, the silica layers were deposited at a rate of 3 angstroms/second, the sputter gas was argon supplied at a flow rate of 500 SCCM, the ion gun was supplied with oxygen at a flow rate of 70 SCCM, the chamber pressure was 0.38 Pa, and the ion gun anode current was 5 amps, i.e., averaging 0.3 mA per $cm^2$ of drum surface.

The filters were then subjected to cumulative baking wherein each filter was sequentially baked at selected incrementally increasing temperatures ranging between 150° C. to 490° C. The filters were baked for one hour at each selected temperature. Stress of the films was determined by measuring the curvature of the substrates using a 633 nm interferometer to measure the reflected wavefront, i.e., number of fringes detected and the information was converted to stress values. Positive values indicate convex curvature, i.e., compressive stress, and negative values indicate concave curvature, i.e., tensile stress.

Figure 7:
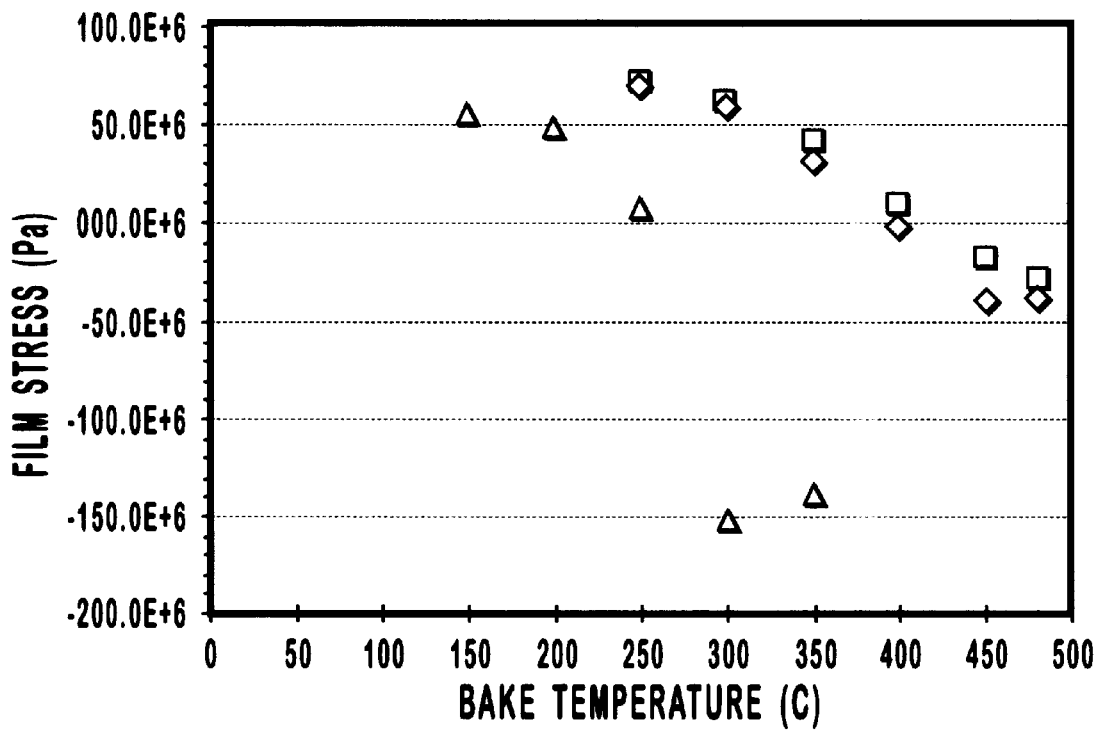
FIG. 7 is a graph showing the film stress vs. the bake temperatures for different optical filters prepared on fused silica substrates.
Figure 8:
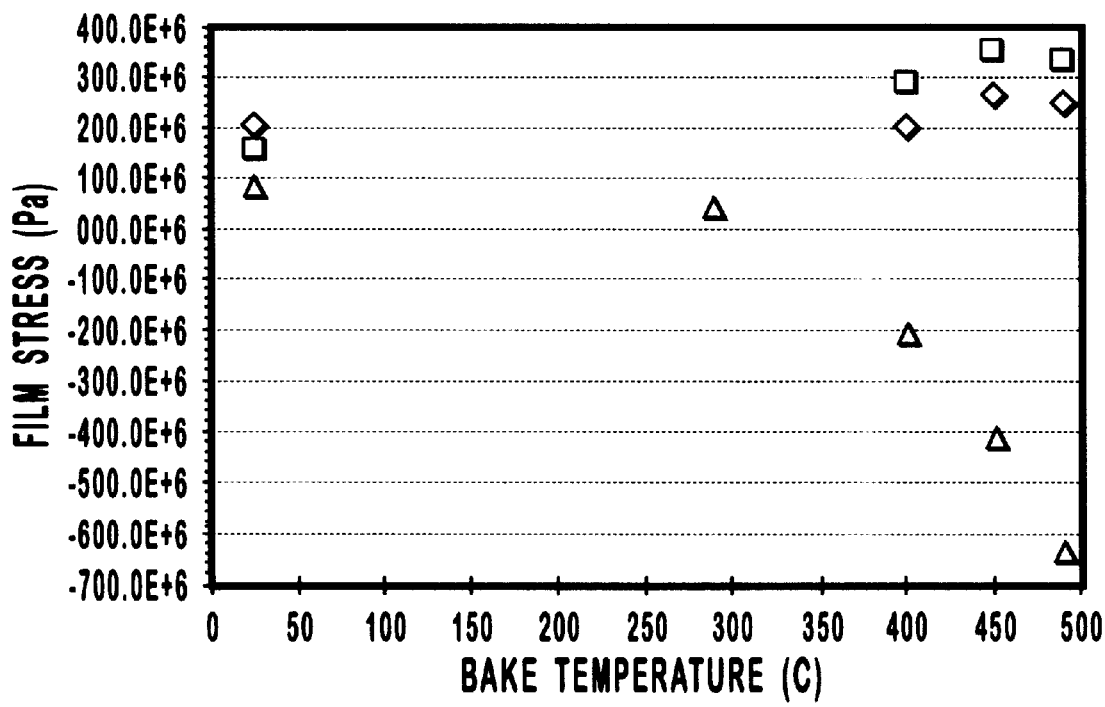
FIG. 8 is a graph showing the film stress vs. the bake temperatures for different optical filters prepared on glass substrates.

FIG. 7 is a graph showing the film stress vs. the bake temperatures for the fused silica substrates and FIG. 8 is a graph showing the film stress vs. the bake temperatures for the glass substrates. For both substrate types, the zirconia-containing filter results are shown by the -▲-; the tantalum oxide-containing filter results are shown by the -■-; and the niobium oxide-containing filter results are shown by the -♦-.

As seen FIG. 7, when the substrates were fused silica, the final stresses for all of the filters are tensile because of the difference in coefficients of thermal expansion. The stress shift from compressive to tensile occurred at much lower temperatures in the zirconia-containing filters, however, than in the niobium oxide- and tantalum oxide- containing filters.

FIG. 8 illustrates that, on glass substrates, the niobium oxide- and tantalum oxide-containing filters increased in compressive stress. The zirconia-containing filters, on the other hand, became excessively tensile.

It was observed in additional experiments that the stress shift from compressive to tensile occurred in the zirconia-containing filters after only about 30 minutes of baking at about 300° C. The niobia- and tantala-containing filters, however, required much higher temperatures and longer baking times to achieve a tensile stress shift. These much higher temperatures would be sufficient to soften glass substrates.

EXAMPLE 6

Control of the tensile stress in zirconia layers prepared in accord with the present invention was demonstrated using the OCLI MetaMode® machine described in Example 1 above. A 50 layer, 4200 nm physical thickness Wide Bandpass filter comprising alternating layers of optically active thicknesses of zirconia and silica was prepared on a soda lime glass substrate 25 mm square by 1 mm thick. The zirconia layers were not monolithic but were split into two sub-layers of equal thickness separated by a silica layer having a very thin physical thickness of 2 nm. The very thin silica layer serves as an isolator material that is optically and physically inert.

The zirconia layers were deposited at a rate of 3 angstroms/second, the sputter gas was argon supplied at a flow rate of 550 SCCM, the ion gun was supplied with oxygen at a flow rate of 320 SCCM, another region of the chamber was supplied with argon gas at a flow rate of 140 SCCM, and the chamber pressure was 0.76 Pa. For the silica layers, the deposition rate was 3 angstroms/second, the sputter gas was neon supplied at a flow rate of 300 SCCM, the ion gun was supplied with oxygen at a flow rate of 140 SCCM, another region of the chamber was supplied with argon at a flow rate of 140 SCCM, and the chamber pressure was 0.4 Pa. For the zirconia layers, the ion gun anode current was 35 amps, i.e., averaging 0.8 mA per $cm^2$ of drum surface and, for the silica layers, the ion gun anode current was 20 amps, i.e., averaging 0.46 mA per $cm^2$ of drum surface.

The filter was subjected to cumulative (sequential) baking for one hour time periods at selected incrementally increasing temperatures ranging between 200° C. and 500° C. The film stress was determined by measuring the curvature of the substrate using a 633 nm interferometer to measure the reflected wavefront, i.e., number of fringes detected and the information was mathematically converted to the stress values.

Figure 9:
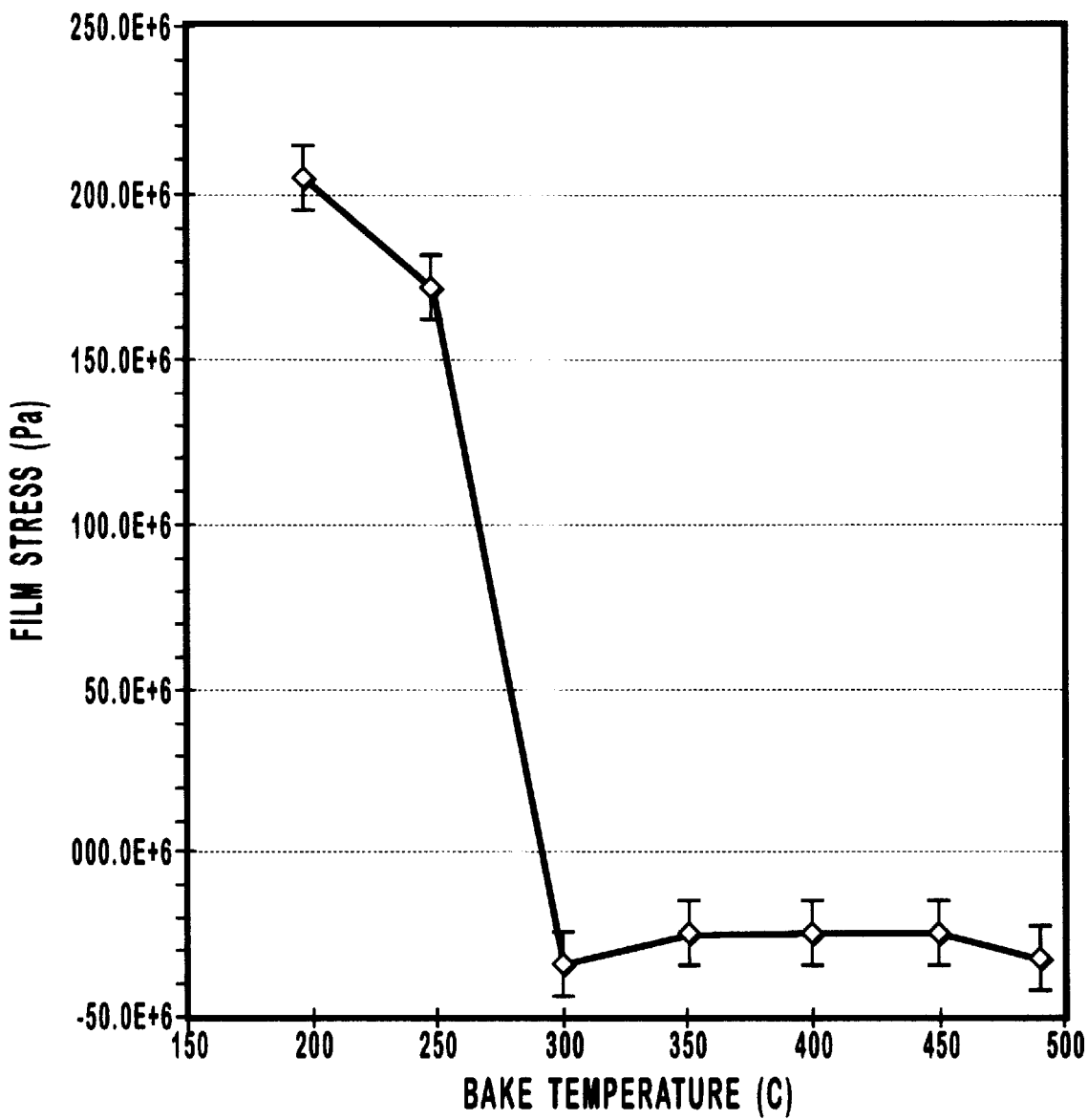
FIG. 9 is a graph of the film stress vs. the bake temperatures for a low net stress optical coating prepared in accord with the present invention.

FIG. 9 is a graph of the film stress vs. the bake temperatures. It can be seen that a low net stress optical coating was achieved. The deposition process, including the ion bombardment, resulted in a more dense microstructure such that the stress shift during annealing was controlled and the development of excessive tensile stress (as seen in FIG. 8) was avoided.

In summary, the above examples demonstrate control of the microstructure during sputter deposition of dense layers of high refractive index zirconia in the development of a selected intra-layer tensile stress during a post-deposition annealing process. Control of the deposition conditions and, in particular, the ion bombardment energy, permits a selected and reproducible post-deposition microstructure that is partially amorphous and partially crystalline to be achieved. When the selected post-deposition microstructure is annealed with a simple, cost-effective and readily reproducible annealing process, i.e., an annealing process that can be effected within a broad but moderate temperature range and for a relatively brief and substantially open-ended time period, the microstructure transforms to a very dense crystalline microstructure. This transformation results in film shrinkage and, because the film is constrained by the glass substrate, the film shrinkage produces a selected amount of tensile stress that compensates for the compressive stress of the silica thin film layers.

In addition to demonstrating low net stress, and unlike low net stress sputtered optical coatings known in the art, the low net stress optical coatings are very dense and, therefore, very moisture stable and also exhibit low optical scatter.

It is believed that the split zirconia layers exhibit less monoclinic phase than the monolithic zirconia layer because the monoclinic microstructure will only form in thin films if the grain sizes are larger than about 30 nm. Since the stress change following annealing is due to volume shrinkage when the film crystallizes and densifies, the more dense, crystalline microstructure present during deposition, the less stress change will occur during annealing. Thus, because the split zirconia layers have more amorphous microstructure, the post-annealing stresses of multilayer thin film stacks comprising split zirconia layers will be more tensile than multilayer thin film stacks comprising monolithic zirconia layers. This relationship allows for adjustment of the final film stress, for example, to adjust for different layer thicknesses used in different optical interference filter designs.

On the basis of similar properties, particularly with respect to thermal expansion coefficients, it is expected that low net stress optical coatings comprising multilayer thin film stacks of alternating silica and titania could also be achieved in accord with the present invention. The ion impingement ratio during deposition which results in the desired post-deposition microstructure could be determined through routine experimentation.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method for preparing an optical device, said method comprising the steps of:
   a) providing a glass substrate for depositing a multilayer optical coating comprising alternating layers of a metal oxide material and silica thereon;
   b) effecting sputter deposition of a layer of the metal oxide material having a selected physical thickness determined by an optical coating design, said deposition comprising the steps of:
      i) using magnetron sputter sources to deposit at least one monolayer of metal;
      ii) using an ion source to effect oxidization of the at least one monolayer of metal to form a layer of metal oxide and adjusting ion bombardment energy to produce a selected partially amorphous and partially crystalline microstructure within said layer of metal oxide; and
      iii) sequentially repeating steps i) and ii) until said layer of metal oxide material having the selected physical thickness has been deposited;
   c) effecting sputter deposition of a dense and compressively-stressed layer of silica having a selected thickness determined by said optical coating design;
   d) repeating steps b and c until a multilayer optical coating is achieved; and
   e) annealing said multilayer optical coating until each layer of metal oxide is transformed to a crystalline microstructure providing an amount of tensile stress such that net stress of the multilayer optical coating is less than about 30 MPa.

2. The method of claim 1 wherein said metal oxide material is zirconium oxide.

3. The method of claim 1 wherein said metal oxide material is titanium oxide.

4. The method of claim 2 wherein said optical coating is annealed at a temperature within the range of about 250° C. to about 500° C. for a period of time of at least about 30 minutes.

5. The method of claim 4 wherein at least one layer of zirconium oxide is split into a plurality of sub-layers separated by at least one substantially optically and physically inert layer of isolator material.

6. The method of claim 5 wherein said isolator material is less than about 20 nm thick.

7. The method of claim 5 wherein said isolator material is less than about 2 nm thick.

8. The method of claim 5 wherein said isolator material comprises silicon dioxide.

9. The method of claim 8 wherein said optical device is a visible light transmitting optical interference filter.

10. A method for preparing an optical device, said method comprising the steps of:
    a) effecting deposition onto a glass substrate of an optical layer of metal oxide material having a selected physical thickness determined by an optical coating design, said deposition comprising the steps of:
       i) using magnetron sputter sources to deposit at least one monolayer of metal;
       ii) using an ion gun to effect oxidization of the at least one monolayer of metal to form a metal oxide and adjusting the ion current to produce a selected partially amorphous and partially crystalline microstructure within said metal oxide;
       iii) sequentially repeating steps i) and ii) until a first metal oxide sub-layer has been deposited;
       iv) forming a substantially optically and physically inert isolator layer over said first metal oxide sub-layer;
       v) sequentially repeating steps i) and ii) until a second metal oxide sub-layer has been deposited on the isolator layer;
    b) effecting sputter deposition of an optical layer of silica, having a selected thickness determined by said optical coating design, onto said optical layer of metal oxide material;
    c) repeating steps (a) and (b) until a multilayer optical coating is produced; and
    d) annealing said multilayer optical coating at a temperature from about 300° C. to about 500° C. until each layer of metal oxide is transformed to a crystalline microstructure providing an amount of tensile stress such that net stress of the multilayer optical coating is less than about 30 MPa.

11. The method of claim 10 wherein said metal oxide material is zirconium oxide.

12. The method of claim 10 wherein said metal oxide material is titanium oxide.

13. The method of claim 10 wherein said isolator layer is less than about 20 nm thick.

14. The method of claim 13 wherein said isolator layer comprises silicon dioxide.

15. A method for preparing an optical device, comprising the steps of:
    a) providing a glass substrate for depositing a multilayer optical coating;
    b) effecting sputter deposition of a layer of a zirconium oxide or titanium oxide, said deposition comprising the steps of:
       i) depositing at least one metal monolayer of zirconium or titanium using a magnetron sputter source;
       ii) oxidizing the at least one metal monolayer using an ion source to form a metal oxide layer of zirconium oxide or titanium oxide while adjusting ion bombardment energy to produce a selected partially amorphous and partially crystalline microstructure within said metal oxide layer; and
       iii) sequentially repeating steps i) and ii) until said metal oxide layer has a selected physical thickness;
    c) effecting sputter deposition of a layer of silica having a selected physical thickness;
    d) repeating steps (b) and (c) until a multilayer optical coating has been formed; and
    e) annealing said multilayer optical coating at a temperature from about 300° C. to about 500° C. until each metal oxide layer is transformed to a crystalline microstructure providing an amount of tensile stress such that net stress of the multilayer optical coating is less than about 30 MPa.

16. The method of claim 15, wherein said multilayer optical coating is annealed for a period of time of at least about 30 minutes.

17. The method of claim 15, further comprising the step of forming one or more metal oxide sub-layers by forming a substantially optically and physically inert layer of an isolator material within a metal oxide layer.

18. The method of claim 17, wherein said isolator material is less than about 20 nm thick.

19. The method of claim 17, wherein said isolator material is silicon dioxide.

20. The method of claim 15, wherein said optical device is a visible light transmitting interference filter.

* * * * *

UNITED STATES PATENT AND TRADEMARK OFFICE
CERTIFICATE OF CORRECTION

PATENT NO. : 5,944,964
DATED : August 31, 1999
INVENTOR(S) : Scott Eugene Solberg; Bradley James Pond It is certified that error appears in the above-identified patent and that said Letters Patent is hereby corrected as shown below:

Title Page,
Other Publications, please insert the following:

Yang et al., "Process effects on radio frequency diode reactively sputtered $ZrO2$ films," J. Vac. Sci. Technol. A 8(6), pgs. 3952-3928, Dec. 1990.

Rujkorakarn et al., "Crystallization of zirconia films by thermal annealing," J. Vac. Sci. Technol. A4(3), pgs. 568-571, June 1986.

Klinger et al., "Evolution of surface roughness and scatter in evaporated zirconia/silica multilayer coatings," SPIE Vol. 678 Optical Thin Films II: New Developments, pgs. 41-50, 1986.

Beauchamp et al., Plastic Coating Development, Final Report, prepared for U.S. Army Natick RD&E Center by Optical Coating Laboratory, Inc., Santa Rosa Division, Dec. 1994.

Holland L. Vacuum Depositiom of Thin Films, Chapman & Hall Ltd., pg. 285, 1961.

Farabaugh E.N. et al., Microstructure of Dielectric Thin Films Formed by E-beam Coevaporation, J. Vac. Sci. Technol. A, Vol. I, No. 2, 356-359, Apr/June 1983.

Martin P.J. et al., Modification of the Optical and Structural Properties of Dielectric $ZrO_2$ Films by Ion-assisted Deposition, J. Appl. Phys., Vol. 55, No. 1, 235-241, January 1984.

Rancourt J.D., Optical Thin Films, Users' Handbook, Deposition Technology, Chapter 2, 45-48, 1987.

UNITED STATES PATENT AND TRADEMARK OFFICE
CERTIFICATE OF CORRECTION

PATENT NO.   : 5,944,964
DATED        : August 31, 1999
INVENTOR(S)  : Scott Eugene Solberg; Bradley James Pond It is certified that error appears in the above-identified patent and that said Letters Patent is hereby corrected as shown below:

Jones F., High-rate Reactive Sputter Deposition of Zirconium Dioxide, J. Vac. Sci. Technol. A, Vol. 6, No. 6, 3088-3097, Nov/Dec. 1988.

Morelli D.W., Interferene Filter Handbook, Part I, Substrates and General Information, 41-44, 1991.

Tench R.J. et al., Characterization of Defect Geometries in Multilayer Optical Coatings, 25th Annual Boulder Damage Symposium, Laser-Induced Damage in Optical Materials: 1993, SPIE Vol. 2114, pp. 415-425, Oct. 1993, Lee C. and Lieberman M.A., Global Model of Ar, $O_2$, $Cl_2$, and Ar/O2 High-density plasma Discharges, J. Vac. Sci. Technol. A, Vol. 13, No. 2, 368-380, Mar/Apr. 1995.

Russak, M.A., Jahnes, C.V., "Reactive magnetron sputtered zirconium oxide and zirconium silicon oxide thin films," J. Vac. Sci. Technol. A 7(3), May/June 1989; 1248-1253.

Pond, B.J., DeBar, J.I., Camiglia, C.K., Raj, T., "Stress reduction in ion beam sputtered mixed oxide films," Applied Optics, Vol. 28 (14), 1989; 2800-2804.

Sankur, H., Gunning, W., "Sorbed water and intrinsic stress in composite $TiO_2SiO_2$ films," J. Appl. Phys. 66(2), 1989; 807-812.

Klinger, R. E. et al., "Optical and Crystalline Inhomogeneity in Evaporated Zirconia," OSA Annual Meeting, Oct. 29-Nov. 2, 1984, San Diego, California.

UNITED STATES PATENT AND TRADEMARK OFFICE
CERTIFICATE OF CORRECTION

PATENT NO.  : 5,944,964
DATED       : August 31, 1999
INVENTOR(S) : Scott Eugene Solberg; Bradley James Pond It is certified that error appears in the above-identified patent and that said Letters Patent is hereby corrected as shown below:

Beauchamp, W.T. et al., "New Capabilities for the Sputtering of Multilayer Optical Coatings," International Conference on Coatings on Glass (ICCG), SaabrŸcken, Germany, October 27-31, 1996.

Sankur, H.O., "Dielectric Composite Thin Films," Rockwell International Science Center, Novemeber, 1989.

Column 7,
Line 17, after "Pa" change "(kg/m-$s^2$))" to -- (kg/(m·$s^2$)) --
Line 64, after "gun" change "15" to -- 15 --
Line 65, after "drum" change "17" to -- 17 --

Column 8,
Line 2, after "pump" change "19" to -- 19 --

Signed and Sealed this

Fourteenth Day of August, 2001

*Attest:*

*Attesting Officer*

NICHOLAS P. GODICI
*Acting Director of the United States Patent and Trademark Office*